United States Patent
Sekiya

(10) Patent No.: US 10,630,278 B2
(45) Date of Patent: Apr. 21, 2020

(54) ELECTRONIC CIRCUIT AND CONTROL METHOD FOR ELECTRONIC CIRCUIT

(71) Applicant: SONY CORPORATION, Tokyo (JP)

(72) Inventor: Akito Sekiya, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/085,094

(22) PCT Filed: Dec. 28, 2016

(86) PCT No.: PCT/JP2016/089074
§ 371 (c)(1),
(2) Date: Sep. 14, 2018

(87) PCT Pub. No.: WO2017/163528
PCT Pub. Date: Sep. 28, 2017

(65) Prior Publication Data
US 2019/0058466 A1 Feb. 21, 2019

(30) Foreign Application Priority Data

Mar. 22, 2016 (JP) ................. 2016-057242

(51) Int. Cl.
*G11C 27/02* (2006.01)
*H03K 5/00* (2006.01)
*H03K 17/00* (2006.01)
*H03K 17/06* (2006.01)
(Continued)

(52) U.S. Cl.
CPC ......... *H03K 17/063* (2013.01); *G11C 27/026* (2013.01); *H03K 17/6871* (2013.01);
(Continued)

(58) Field of Classification Search
CPC ..... G11C 27/026; G11C 27/024; G11C 27/02; G01R 13/342; H03K 17/063
(Continued)

(56) References Cited

U.S. PATENT DOCUMENTS 6,052,000 A * 4/2000 Nagaraj ............... G11C 27/024
327/91
6,977,536 B2 * 12/2005 Chin-Chieh ......... H03K 5/1565
327/116
(Continued)

FOREIGN PATENT DOCUMENTS

CN       103683864 A    3/2014
DE    102013217173 A1   3/2014
(Continued)

OTHER PUBLICATIONS

International Search Report and Written Opinion of PCT Application No. PCT/JP2016/089074, dated Mar. 28, 2017, 09 pages of ISRWO.

*Primary Examiner* — Anh Q Tra
(74) *Attorney, Agent, or Firm* — Chip Law Group

(57) ABSTRACT

To control a drive voltage of a transistor to be constant in a circuit that captures signals. A duty ratio control unit changes a duty ratio of a predetermined input periodic signal and outputs the predetermined input periodic signal as an output periodic signal. A transistor is a transistor that outputs an input signal input to a source from a drain as an output signal. A charge control unit charges the condenser with a predetermined voltage in a case in which the output periodic signal is not at a specific level. A transistor drive unit applies the charged predetermined voltage between a gate and the source of the transistor in a case in which the output periodic signal is at the specific level.

7 Claims, 13 Drawing Sheets

(51) Int. Cl.
*H03M 1/14* (2006.01)
*H03K 17/687* (2006.01)
*H03M 1/46* (2006.01)
*H03M 1/12* (2006.01)

(52) U.S. Cl.
CPC ...... *H03M 1/14* (2013.01); *H03K 2217/0036* (2013.01); *H03K 2217/0081* (2013.01); *H03M 1/1245* (2013.01); *H03M 1/466* (2013.01)

(58) Field of Classification Search
USPC ..................................... 327/91–97, 173–175
See application file for complete search history.

(56) References Cited

U.S. PATENT DOCUMENTS

| | | | |
|---|---|---|---|
| 8,558,586 B1 | 10/2013 | Martin et al. | |
| 8,674,863 B2 * | 3/2014 | Grilo | H03K 17/063 341/122 |
| 9,762,223 B2 * | 9/2017 | Magnoni | H03K 3/017 |
| 2005/0258874 A1 * | 11/2005 | Kudo | G11C 27/02 327/91 |
| 2006/0202722 A1 * | 9/2006 | Yen | G11C 27/02 327/94 |
| 2009/0201071 A1 | 8/2009 | Jinta | |
| 2013/0235026 A1 | 9/2013 | Yamamoto | |
| 2016/0027528 A1 * | 1/2016 | Verbruggen | H03M 1/1245 341/122 |

FOREIGN PATENT DOCUMENTS

| | | |
|---|---|---|
| JP | 2004-228988 A | 8/2004 |
| JP | 2005-143068 A | 6/2005 |
| JP | 2009-188867 A | 8/2009 |
| JP | 5230853 B2 | 7/2013 |
| WO | 2012/137728 A1 | 10/2012 |

* cited by examiner

| OUTPUT SAMPLING CLOCK CLK$_{out}$ | OPERATION OF BOOTSTRAP CIRCUIT |
|---|---|
| LOW LEVEL | OFF STATE OF TRANSISTOR AND CHARGING OF CONDENSER WITH Vdd |
| HIGH LEVEL | OUTPUT ANALOG SIGNAL (Vin)+CHARGING VOLTAGE (Vdd) TO GATE OF TRANSISTOR TO SET TRANSISTOR TO ON STATE | ns
ELECTRONIC CIRCUIT AND CONTROL METHOD FOR ELECTRONIC CIRCUIT

CROSS REFERENCE TO RELATED APPLICATIONS

This application is a U.S. National Phase of International Patent Application No. PCT/JP2016/089074 filed on Dec. 28, 2016, which claims priority benefit of Japanese Patent Application No. JP 2016-057242 filed in the Japan Patent Office on Mar. 22, 2016. Each of the above-referenced applications is hereby incorporated herein by reference in its entirety.

TECHNICAL FIELD

The present technology relates to an electronic circuit and a control method for the electronic circuit. More particularly, the present technology relates to an electronic circuit that captures signals and a control method for the electronic circuit.

BACKGROUND ART

Sampling hold circuits that capture (sample) and hold analog signals have been used in analog-digital converters and the like since the past. Such a sampling hold circuit includes, for example, a transistor that outputs, from a drain thereof, an analog signal that has been input to a gate thereof and a condenser that holds the output analog signal. When a gate voltage of the transistor is fixed, fluctuation of a source voltage (i.e., the level of the analog signal) causes a gate-source voltage to fluctuate and thus an ON resistance of the transistor changes. Due to the change of the ON resistance, the level of the analog signal output from the drain is no longer proportional to the level of the analog signal input to the source, which causes accuracy of AD conversion to deteriorate. For this reason, it is desirable to maintain a constant gate-source voltage.

Therefore, a sampling hold circuit in which a bootstrap circuit is connected to a gate and a source of a transistor has been proposed (e.g., refer to Patent Literature 1). This bootstrap circuit charges a condenser by switching connection destinations of both ends of the condenser to a power supply terminal and a ground terminal when a sampling clock is at a low level. On the other hand, when the sampling clock is at a high level, the bootstrap circuit switches the connection destinations of both ends of the condenser to the source and the gate of the transistor and applies a charging voltage of the condenser between the gate and the source.

CITATION LIST

Patent Literature

Patent Literature 1: JP 2004-228988A

DISCLOSURE OF INVENTION

Technical Problem

In the above-described related art, a drive voltage (the gate-source voltage) of the transistor is maintained constant with respect to the fluctuation of the source voltage (i.e., the level of the analog signal) by using the bootstrap circuit. However, in the above-described related art, there is concern of the gate-source voltage fluctuating if the high level period of the sampling clock becomes longer. This is because a leakage current is generated in the switch for switching the connection destinations of the condenser and the leakage current causes the charging voltage of the condenser to decrease over time. Although there is a method of shortening the high level period of the sampling clock by using a frequency divider, it is necessary to drive the frequency divider with a clock having a higher frequency than the sampling clock and thus there is concern of increasing power consumption. As described above, the above-described related art has the problem that it is difficult to control the drive voltage (the gate-source voltage) of the transistor to be constant.

The present technology has been created in view of the above-described situation and aims to control a drive voltage of a transistor to be constant in a circuit that captures signals.

Solution to Problem

The present technology has been devised to solve the above-described problem, and a first aspect thereof is an electronic circuit and a control method thereof, the electronic circuit including: a duty ratio control unit configured to change a duty ratio of a predetermined input periodic signal and output the predetermined input periodic signal as an output periodic signal; a transistor configured to output an input signal input to a source from a drain as an output signal; a condenser; a charge control unit configured to charge the condenser with a predetermined voltage in a case in which the output periodic signal is not at a specific level; and a transistor drive unit configured to apply the charged predetermined voltage between a gate and the source of the transistor in a case in which the output periodic signal is at the specific level. Accordingly, the effect that the predetermined voltage charged in the condenser is applied to the gate and the source of the transistor can be exhibited.

In addition, according to this first aspect, the duty ratio control circuit may make a period in which the predetermined input periodic signal is at the specific level shorter than a predetermined time. Accordingly, the effect that an input signal is captured in synchronization with the periodic signal having the period in which the signal is at the specific level shorter than the predetermined time can be exhibited.

In addition, according to this first aspect, the duty ratio control circuit may include an inversion unit configured to invert the predetermined input periodic signal and output the predetermined input periodic signal as an inverted signal, a delay unit configured to delay the inverted signal and output the inverted signal as a delay signal, and a selection unit configured to select the delay signal and output the delay signal as the output periodic signal in the case in which the predetermined input periodic signal is at the specific level. Accordingly, the effect that the delay signal is selected in the case in which the input periodic signal is at the specific level can be exhibited.

In addition, according to this first aspect, the charge control unit may connect both ends of the condenser to two terminals having an inter-terminal voltage of the predetermined voltage in the case in which the output periodic signal is not at the specific level. The transistor drive unit may connect both ends of the condenser to the gate and the source in the case in which the output periodic signal is at the specific level. Accordingly, the effect that both ends of the condenser are connected to two terminals or the gate and the source can be exhibited.

In addition, according to this first aspect, a holding unit configured to hold the output signal may be further included. Accordingly, the effect that the signal is sampled and held can be exhibited.

In addition, according to this first aspect, a conversion unit configured to convert the held output signal into a digital signal may be further included. Accordingly, the effect that the held signal is converted into the digital signal can be exhibited.

In addition, according to this first aspect, a capacitor configured to hold the output signal; and a charge/discharge control unit configured to charge or discharge the capacitor in accordance with the output periodic signal may be included. Accordingly, the effect that filtering is performed on a captured signal can be exhibited.

Advantageous Effects of Invention

According to the present technology, an excellent effect that a drive voltage of a transistor can be controlled to be constant in a circuit that captures signals can be exhibited. Note that effects described herein are not necessarily limitative, and any effect that is desired to be described in the present disclosure may be admitted.

MODE(S) FOR CARRYING OUT THE INVENTION

Exemplary embodiments for implementing the present technology (which will be referred to as embodiments) will be described below. The description will be provided in the following order.
1. First embodiment (example of controlling duty ratio of sampling clock)
2. Second embodiment (example of controlling duty ratio of switching clock)

1. First Embodiment

[Configuration Example of Electronic Circuit]

Figure 1:
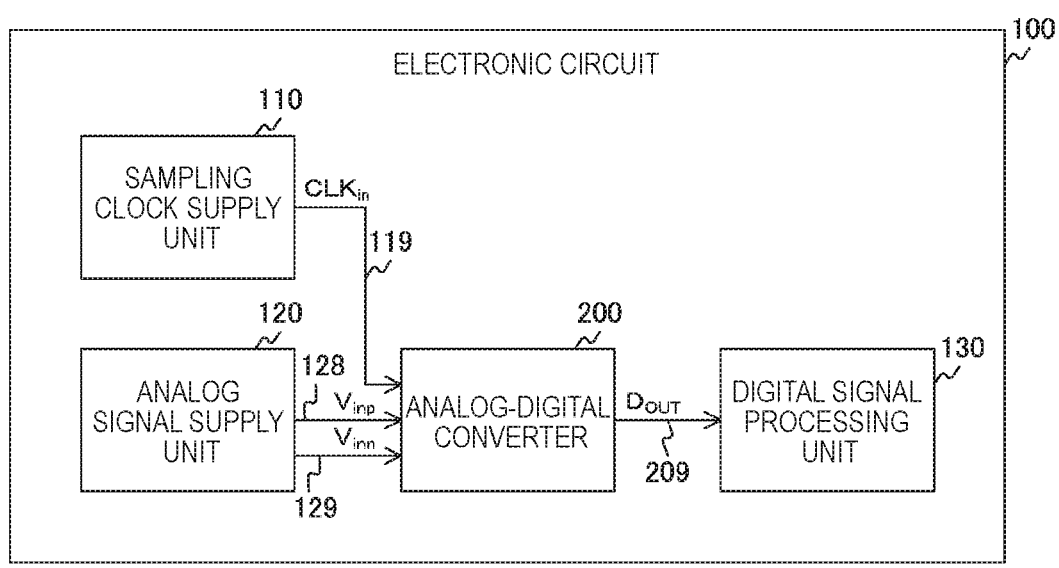
FIG. 1 is a block diagram illustrating a configuration example of an electronic circuit according to a first embodiment of the present technology.

FIG. 1 is a block diagram illustrating a configuration example of an electronic circuit 100 according to a first embodiment. The electronic circuit 100 is a circuit that processes digital signals and is mounted in, for example, environment monitoring equipment, digital health equipment, wireless communication equipment, or the like. The electronic circuit 100 includes a sampling clock supply unit 110, an analog signal supply unit 120, an analog-digital converter 200, and a digital signal processing unit 130.

The sampling clock supply unit 110 generates a periodic signal having a predetermined frequency as a sampling clock $CLK_{SMP}$ and supplies the signal to the analog-digital converter 200 via a signal line 119.

The analog signal supply unit 120 supplies an analog signal to the analog-digital converter 200 via signal lines 128 and 129. The analog signal is, for example, a differential signal, and includes a positive-side input voltage $V_{inp}$ and a negative-side input voltage $V_{inn}$. As the analog signal supply unit 120, for example, sensors such as a temperature sensor, a humidity sensor, and a pressure sensor and an antenna are assumed. Note that the analog signal supply unit 120 may supply a current instead of a voltage as an analog signal. In addition, the analog signal supply unit 120 may supply a single-ended signal instead of a differential signal.

The analog-digital converter 200 samples an analog input voltage $V_{in}$ in synchronization with the input sampling clock $CLK_{in}$ and converts the voltage into a digital signal $D_{out}$. Then, the analog-digital converter 200 supplies the digital signal $D_{out}$ to the digital signal processing unit 130 through a signal line 209.

The digital signal processing unit 130 executes a predetermined process on the digital signal $D_{out}$. The process to be executed is environment monitoring, a wireless communication process, or the like using a measured value of a temperature sensor, a humidity sensor, a pressure sensor, or the like.

[Configuration Example of Analog-Digital Converter]

Figure 2:
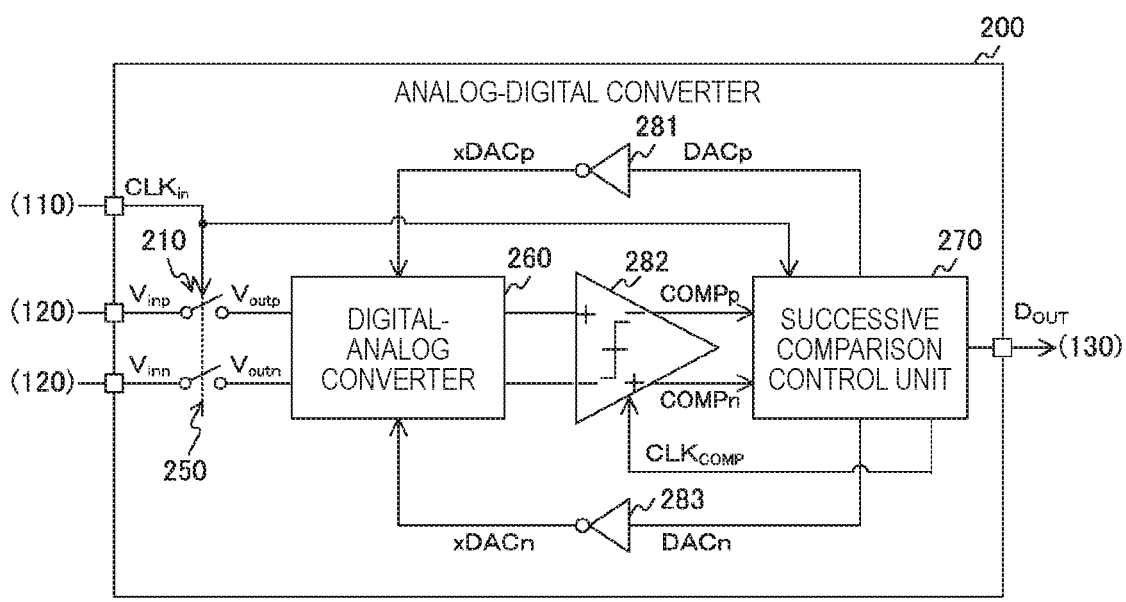
FIG. 2 is a block diagram illustrating a configuration example of an analog-digital converter according to the first embodiment of the present technology.

FIG. 2 is a block diagram illustrating a configuration example of the analog-digital converter 200 according to the first embodiment. The analog-digital converter 200 includes a positive-side sampling hold circuit 210, a negative-side sampling hold circuit 250, and a digital-analog converter 260. In addition, the analog-digital converter 200 includes a comparator 282, inversion units 281 and 283, and a successive comparison control unit 270.

The positive-side sampling hold circuit 210 samples the positive-side input voltage $V_{inp}$ in synchronization with the input sampling clock $CLK_{in}$ and holds the voltage. The positive-side sampling hold circuit 210 supplies the held positive-side input voltage $V_{inp}$ to the digital-analog converter 260 as a positive-side output voltage $V_{outp}$.

The negative-side sampling hold circuit 250 samples the negative-side input voltage $V_{inn}$ in synchronization with the input sampling clock $CLK_{in}$ and holds the voltage. The negative-side sampling hold circuit 250 supplies the held negative-side input voltage $V_{inn}$ to the digital-analog converter 260 as a negative-side output voltage $V_{outn}$.

The digital-analog converter 260 increases or decreases the positive-side output voltage $V_{outp}$ and the negative-side output voltage $V_{outn}$ in accordance with a positive-side control signal xDACp and a negative-side control signal xDACn. A data size of each of the positive-side control signal xDACp and the negative-side control signal xDACn is N (N is an integer)–1 bit. The digital-analog converter 260 supplies the increased or decreased positive-side output voltage $V_{outp}$ and negative-side output voltage $V_{outn}$ to a non-inverting input terminal (+) and an inverting input terminal (−) of the comparator 282.

The comparator 282 compares a voltage of the non-inverting input terminal (+) and a voltage of the inverting input terminal (−) in synchronization with a control clock $CLK_{COMP}$. The comparator 282 supplies comparison results COMPp and COMPn to the successive comparison control unit 270.

The successive comparison control unit 270 generates the control clock $CLK_{COMP}$, a positive-side control signal DACp, and a negative-side control signal DACn on the basis of the comparison result of the comparator 282. The successive comparison control unit 270 supplies the positive-side control signal DACp to the inversion unit 281 and the negative-side control signal DACn to the inversion unit 283. In addition, the successive comparison control unit 270 generates the control clock $CLK_{COMP}$ and supplies it to the comparator 282. In addition, the successive comparison control unit 270 generates an N-bit digital signal $D_{out}$ from N comparison results and outputs the signal to the digital signal processing unit 130.

As described above, the successive comparison control unit 270 performs successive comparison control without using an external clock signal. The analog-digital converter 200 that does not use an external clock as described is called an internal synchronous type. A one-shot operation of AD conversion is possible as a secondary effect of the internal synchronous type. Here, the one-shot operation is an operation that continues from a start of AD conversion due to only one signal change caused by an operation of a push switch or the like to an end of the AD conversion.

One the other hand, a converter that performs successive comparison control using an external clock signal is called an external synchronous type. The analog-digital converter 200 may be of the external synchronous type. In this case, a clock signal having a higher frequency than that of the input sampling clock $CLK_{in}$ is input to the successive comparison control unit 270 and the successive comparison control unit 270 operates in synchronization with the clock signal.

The inversion unit 281 inverts each bit of the positive-side control signal DACp. The inversion unit 281 supplies the inversion-processed control signal to the digital-analog converter 260 as the positive-side control signal xDACp.

The inversion unit 283 inverts each bit of the negative-side control signal DACn. The inversion unit 283 supplies the inversion-processed control signal to the digital-analog converter 260 as the negative-side control signal xDACn.

Note that, although the analog-digital converter 200 performs AD conversion on a differential signal, the converter may perform AD conversion on a single-ended signal. In this case, for example, an input voltage is input to the positive-side sampling hold circuit 210 and a fixed voltage is input to the negative-side sampling hold circuit 250.

In addition, the circuit other than the positive-side sampling hold circuit 210 and the negative-side sampling hold circuit 250 is an example of the conversion unit described in the claims.

[Configuration Example of Positive-Side Sampling Hold Circuit]

Figure 3:
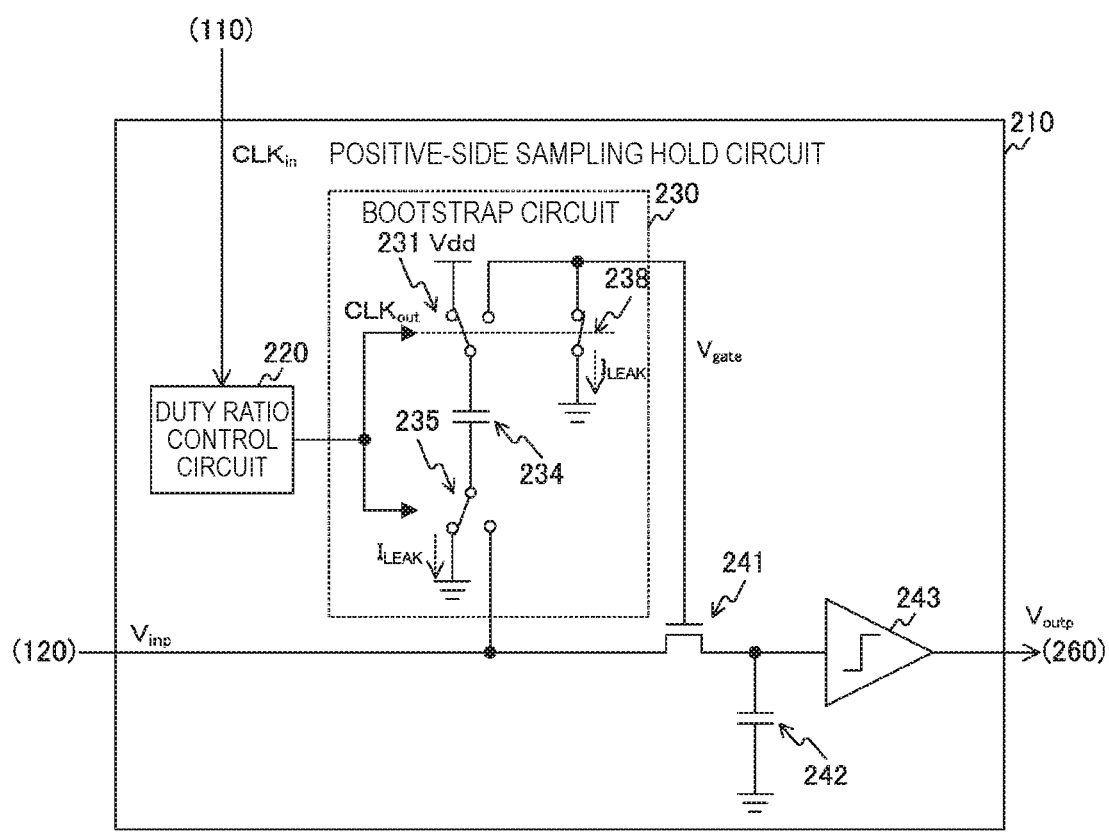
FIG. 3 is a circuit diagram illustrating a configuration example of a positive-side sampling hold circuit according to the first embodiment of the present technology.

FIG. 3 is a circuit diagram illustrating a configuration example of the positive-side sampling hold circuit 210 according to the first embodiment. The positive-side sampling hold circuit 210 includes a duty ratio control circuit 220, a bootstrap circuit 230, an N-type transistor 241, a condenser 242, and an amplifier 243. In addition, the bootstrap circuit 230 includes a power-supply-side switch 231, a condenser 234, a ground-side switch 235, and a gate-side switch 238. Note that a configuration of the negative-side sampling hold circuit 250 is similar to that of the positive-side sampling hold circuit 210.

The duty ratio control circuit 220 changes a duty ratio of the input sampling clock $CLK_{in}$. For example, when a ratio of a high level period to a cycle is defined as a duty ratio, the duty ratio control circuit 220 reduces the duty ratio (i.e., shortens the high level period). The duty ratio control circuit 220 supplies the input sampling clock $CLK_{in}$ whose duty ratio has been reduced to the bootstrap circuit 230 as an output sampling clock $CLK_{out}$. Note that the duty ratio control circuit 220 is an example of the duty ratio control unit described in the claim.

The power-supply-side switch 231 switches a connection destination of a power-supply-side terminal of the condenser 234 in accordance with the output sampling clock $CLK_{out}$. In a case in which the output sampling clock $CLK_{out}$ is at a low level, the power-supply-side switch 231 connects the power-supply-side terminal of the condenser 234 to a power supply terminal of a power supply voltage Vdd. On the other hand, in a case in which the output sampling clock $CLK_{out}$ is at a high level, the power-supply-side switch 231 connects the power-supply-side terminal of the condenser 234 to the gate of the N-type transistor 241 and the gate-side switch 238.

The ground-side switch 235 switches a connection destination of a ground-side terminal of the condenser 234 in accordance with the output sampling clock $CLK_{out}$. In the case in which the output sampling clock $CLK_{out}$ is at a low level, the ground-side switch 235 connects the ground-side terminal of the condenser 234 to a ground terminal. On the other hand, in the case in which the output sampling clock $CLK_{out}$ is at a high level, the ground-side switch 235 connects the ground-side terminal of the condenser 234 to the source of the N-type transistor 241 and the analog signal supply unit 120. Here, the power supply voltage Vdd between the power supply terminal and the ground terminal is assumed to be higher than a threshold voltage of the N-type transistor 241.

The gate-side switch 238 opens and closes the path between the gate of the N-type transistor 241 and a ground terminal in accordance with the output sampling clock $CLK_{out}$. An end of the gate-side switch 238 is connected to the power-supply-side switch 231 and the gate of the N-type transistor 241, and the other end thereof is connected to the ground terminal. In addition, the gate-side switch 238 transitions to an open state in a case in which the output sampling clock $CLK_{out}$ is at a high level and to a closed state in a case in which the output sampling clock $CLK_{out}$ is at a low level.

The N-type transistor 241 outputs the input voltage $V_{in}$ input to the source from the drain. As the N-type transistor 241, for example, a metal-oxide-semiconductor (MOS) transistor is used. The source of the N-type transistor 241 is connected to the analog signal supply unit 120 and the ground-side switch 235, and the gate thereof is connected to the power-supply-side switch 231 and the gate-side switch 238. In addition, the drain of the N-type transistor 241 is connected to the condenser 242 and the amplifier 243. Note that the N-type transistor 241 is an example of the transistor described in the claims.

The condenser 242 holds a signal sampled by the N-type transistor 241. The amplifier 243 amplifies a holding voltage of the condenser 242 and outputs the voltage to the digital-analog converter 260 as the positive-side output voltage $V_{outp}$. Note that the condenser 242 is an example of the holding unit described in the claims.

With the above-described configuration, the power-supply-side switch 231 and the ground-side switch 235 connect both ends of the condenser 234 to the power supply terminal and the ground terminal to perform charging with the power supply voltage Vdd in the case in which the output sampling clock $CLK_{out}$ is at a low level. In addition, the gate-side switch 238 connects the gate of the N-type transistor 241 to the ground terminal to control the N-type transistor 241 in an OFF state.

On the other hand, in the case in which the output sampling clock $CLK_{out}$ is at a high level, the power-supply-side switch 23 1and the ground-side switch 235 connect both ends of the condenser 234 to the gate and the source of the N-type transistor 241. Accordingly, a voltage obtained by adding the charging voltage Vdd of the condenser to the voltage (the positive-side input voltage $V_{inp}$) of the source is applied to the gate of the N-type transistor 241. That is, the charging voltage (Vdd) of the condenser is applied between the gate and the source of the N-type transistor 241.

Here, a circuit of a comparative example in which the power supply terminal is directly connected to the gate of the N-type transistor 241 without providing the bootstrap circuit 230 is assumed. In this comparative example, a gate-source voltage $V_{gs}$ of the N-type transistor 241 fluctuates due to a voltage ($V_{inp}$) of the source. In an MOS transistor, generally, an ON resistance of the MOS transistor changes due to fluctuation of the gate-source voltage $V_{gs}$. Due to the change of the ON resistance, the level of an analog signal input to the source is not proportional to the level of an analog signal output from the drain, and thus accuracy of AD conversion decreases. The influence of inaccurate AD conversion appears as distortion in a trajectory of a digital signal.

On the other hand, the bootstrap circuit 230 is provided in the positive-side sampling hold circuit 210. The bootstrap circuit 230 maintains a constant gate-source voltage $V_{gs}$ by inserting the condenser 234 between the gate and the source of the N-type transistor 241 through the period in which the output sampling clock $CLK_{out}$ is at a high level. Thus, by providing the bootstrap circuit 230, the analog-digital converter 200 can perform accurate AD conversion.

However, if the period in which the output sampling clock $CLK_{out}$ is at a high level becomes longer, there is concern of the charging voltage of the condenser 234 decreasing due to a leakage current $I_{LEAK}$ generated in the ground-side switch 235 or the gate-side switch 238 as described above. Particularly, the influence of the leakage current $I_{LEAK}$ becomes conspicuous in fine process generations. In addition, the high level period becomes longer as a frequency of the input sampling clock $CLK_{in}$ becomes lower, and thus the influence of the leakage current $I_{LEAK}$ becomes conspicuous. Since the demand for low power consumption has increased in recent years, the frequency of the input sampling clock $CLK_{in}$ is often lowered for the purpose of reducing power consumption of a system. Thus, it is necessary to restrict the influence of the leakage current $I_{LEAK}$, i.e., a reduction of a charging voltage of the condenser 234.

In view of the above, it is desirable for the period in which the output sampling clock $CLK_{out}$ is at a high level to be short (i.e., a duty ratio to be small). It is desirable for the duty ratio to be, for example, smaller than ½.

Therefore, the duty ratio control circuit 220 sets the period in which the output sampling clock $CLK_{out}$ is at a high level to be shorter than a predetermined time (e.g., half of a clock cycle). Accordingly, by restricting a decrease in the charging voltage of the condenser 234 caused by the leakage current $I_{LEAK}$, the gate-source voltage of the N-type transistor 241 can be maintained constant.

Note that a P-type transistor may be provided instead of the N-type transistor 241. In that case, one end of the gate-side switch 238 may be connected to the power supply terminal, the positions of the power-supply-side switch 231 and the ground-side switch 234 may be switched. In addition, although the positive-side sampling hold circuit 210 performs sampling when the input sampling clock $CLK_{in}$ is at a high level, the circuit may perform sampling when the clock is at a low level. In this case, the power-supply-side switch 231 and the ground-side switch 235 may charge the condenser 234 when the input sampling clock $CLK_{in}$ is at a high level.

[Configuration Example of Switch]

Figure 4:
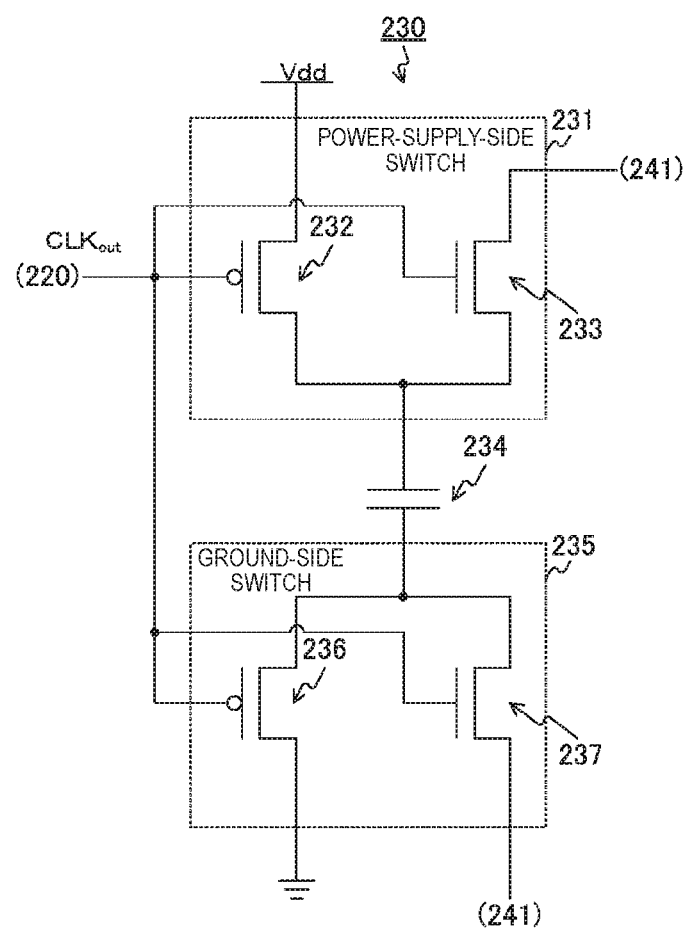
FIG. 4 is a circuit diagram illustrating a configuration example of a power-supply-side switch and a ground-side switch according to the first embodiment of the present technology.

FIG. 4 is a circuit diagram illustrating a configuration example of the power-supply-side switch 231 and the ground-side switch 235 according to the first embodiment. The power-supply-side switch 231 includes a P-type transistor 232 and an N-type transistor 233. In addition, the ground-side switch 235 includes a P-type transistor 236 and an N-type transistor 237. MOS transistors, for example, are used for the P-type transistor 232, the N-type transistor 233, the P-type transistor 236, and the N-type transistor 237.

The P-type transistors 232 and 236 connect the power supply terminal and the ground terminal to both ends of the condenser 234 to perform charging with the power supply voltage Vdd in the case in which the output sampling clock $CLK_{out}$ is at a low level. Note that the P-type transistors 232 and 236 are an example of the charge control unit described in the claims. In addition, although the P-type transistors 232 and 236 connect the power supply terminal and the ground terminal to the condenser 234, terminals other than the power supply terminal and the ground terminal can be connected thereto as long as they are two terminals having an inter-terminal voltage exceeding the threshold voltage of the N-type transistor 241.

The N-type transistors 233 and 237 connect both ends of the condenser 234 to the source and the gate of the N-type transistor 241 to apply the charging voltage of the condenser 234 between the gate and the source in the case in which the output sampling clock $CLK_{out}$ is at a high level. Note that the N-type transistors 233 and 237 are an example of the transistor drive unit described in the claims.

Figures 5, 6:
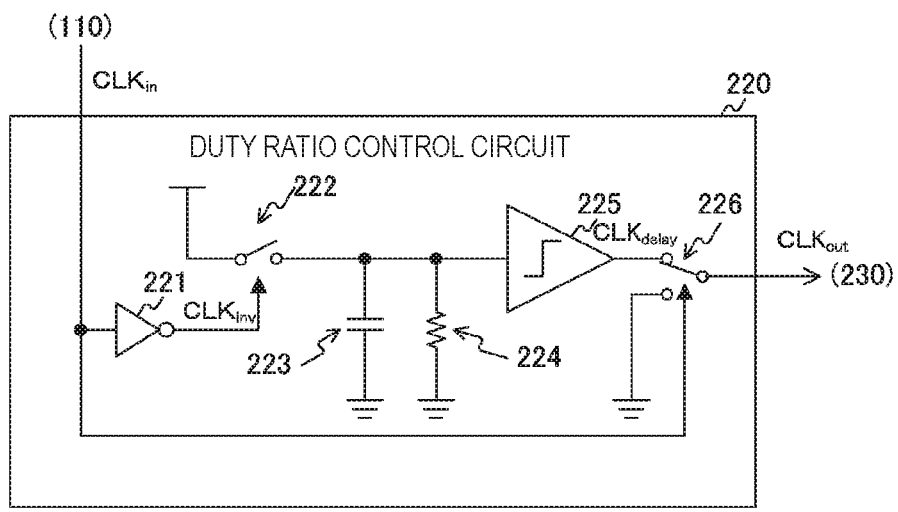
FIG. 5 is a diagram illustrating an example of an operation of a bootstrap circuit according to the first embodiment of the present technology.
FIG. 6 is a circuit diagram illustrating a configuration example of a duty ratio control circuit according to the first embodiment of the present technology.

FIG. 5 is a diagram illustrating an example of an operation of the bootstrap circuit 230 according to the first embodiment. In the case in which the output sampling clock $CLK_{out}$ is at a low level, the bootstrap circuit 230 sets the N-type transistor 241 to be in an OFF state and charges the condenser 234 with the power supply voltage Vdd. On the other hand, in the case in which the output sampling clock $CLK_{out}$ is at a high level, the bootstrap circuit 230 outputs the voltage obtained by adding the charging voltage (Vdd) of the condenser to the analog signal to the gate of the N-type transistor 241 and thereby sets the N-type transistor 241 to be in an ON state. Since the analog signal is input to the source of the N-type transistor 241, the gate-source voltage $V_{gs}$ of the N-type transistor 241 is maintained at a constant voltage (Vdd) regardless of the analog signal.

[Configuration Example of Duty Ratio Control Circuit]

FIG. 6 is a circuit diagram illustrating a configuration example of the duty ratio control circuit 220 according to the first embodiment. The duty ratio control circuit 220 includes an inverter 221, a switch 222, a condenser 223, a resistor 224, an amplifier 225, and a switch 226.

The inverter 221 inverts the input sampling clock $CLK_{in}$. The inverter 221 supplies the inverted signal to the switch 222 as an inverted signal $CLK_{inv}$. Note that the inverter 221 is an example of the inversion unit described in the claims.

The switch 222 opens and closes a path in accordance with the inverted signal $CLK_{inv}$. An end of the switch 222 is connected to the power supply terminal, and the other end thereof is connected to the condenser 223, the resistor 224, and the amplifier 225. The switch 222 transitions to a closed state in a case in which the inverted signal $CLK_{inv}$ is at a high level, and transitions to an open state in a case in which the inverted signal $CLK_{inv}$ is at a low level.

The condenser 223 and the resistor 224 constitute an RC circuit. The RC circuit delays the inverted signal and outputs the signal as a delay signal $CLK_{delay}$. A delay time is determined using a time constant (=R×C) of the RC circuit. Here, R represents a resistance of the resistor 224, and C represents a capacity of the condenser 223. Note that the circuit including the condenser 223 and the resistor 224 is an example of the delay unit described in the claims.

The amplifier 225 amplifies the delay signal $CLK_{delay}$. The amplifier 225 supplies the amplified delay signal $CLK_{delay}$ to the switch 226.

The switch 226 selects the delay signal $CLK_{delay}$ and outputs the signal as an output clock signal $CLK_{out}$ in the case in which the input sampling clock $CLK_{in}$ is at a high level. On the other hand, in the case in which the input sampling clock $CLK_{in}$ is at a low level, the switch 226 outputs the low level as the output clock signal $CLK_{out}$. Note that the switch 226 is an example of the selection unit described in the claims.

Figure 7:
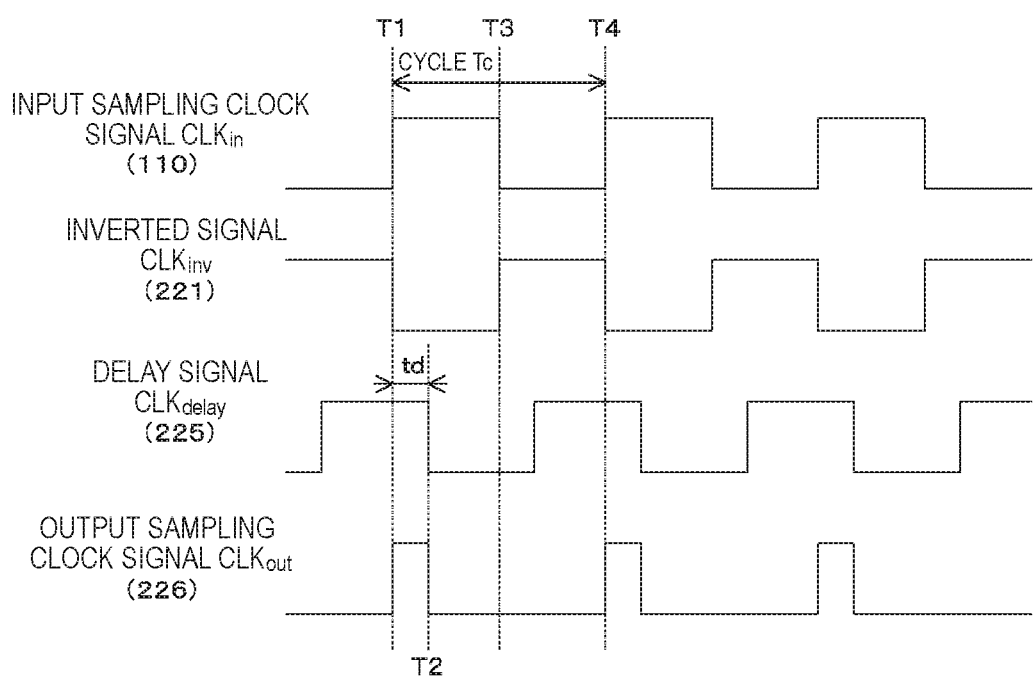
FIG. 7 is a timing chart illustrating an example of an operation of the duty ratio control circuit according to the first embodiment of the present technology.

FIG. 7 is a timing chart illustrating an example of an operation of the duty ratio control circuit 220 according to the first embodiment. The inverter 221 inverts the input sampling clock $CLK_{in}$ and outputs the clock as the inverted signal $CLK_{inv}$. For example, in a case in which the input sampling clock $CLK_{in}$ rises at a timing T1 and falls at a timing T3, the inverted signal $CLK_{inv}$ falls at the timing T1 and rises at the timing T3.

In addition, the condenser 223 and the resistor 224 delay the inverted signal and output the signal as the delay signal $CLK_{delay}$. When the delay time is set to td, the delay signal $CLK_{delay}$ falls at a timing T2 at which td has elapsed from the timing T1.

In addition, the switch 226 selects the delay signal $CLK_{delay}$ and outputs the signal as the output sampling clock $CLK_{out}$ in the case in which the input sampling clock $CLK_{in}$ is at a high level. The delay signal $CLK_{delay}$ is selected in the period, for example, from the timing T1 to T3. Since the delay signal $CLK_{delay}$ falls at the timing T2, the period in which the output clock signal $CLK_{out}$ is at a high level is the period from the timing T1 to T2. The period from the timing T1 to T2 is shorter than the high level period in the cycle of the input sampling clock $CLK_{in}$. As described above, when the inverted signal is delayed and the delay signal is selected when the signal before inversion ($CLK_{in}$) is at a high level, the duty ratio can be reduced.

Here, the change of the duty ratio can also be realized by a frequency divider and a logic gate. For example, the frequency divider divides the output sampling clock $CLK_{out}$ at a constant division ratio m. m is an integer and is set to, for example, "2." In addition, the logic gate selects, for example, a divided clock through the period in which the output sampling clock $CLK_{out}$ is at a high level. Accordingly, the duty ratio can be reduced.

However, in the configuration in which the frequency divider is used, it is necessary to drive the frequency divider at a frequency that is m times the output sampling clock $CLK_{out}$. Thus, power consumption increases in comparison to a configuration in which no frequency divider is used. In the case in which a frequency of the sampling clock is lowered for the purpose of reducing power consumption as described above, a frequency divider is added, which causes a consequence contradicting the purpose.

On the other hand, since no frequency divider is used in the duty ratio control circuit 220, it is not necessary to generate a clock having a higher frequency than the output sampling clock $CLK_{out}$. Thus, power consumption can be reduced further than in the configuration in which the frequency divider is used.

[Configuration Example of Digital-Analog Converter]

Figure 8:
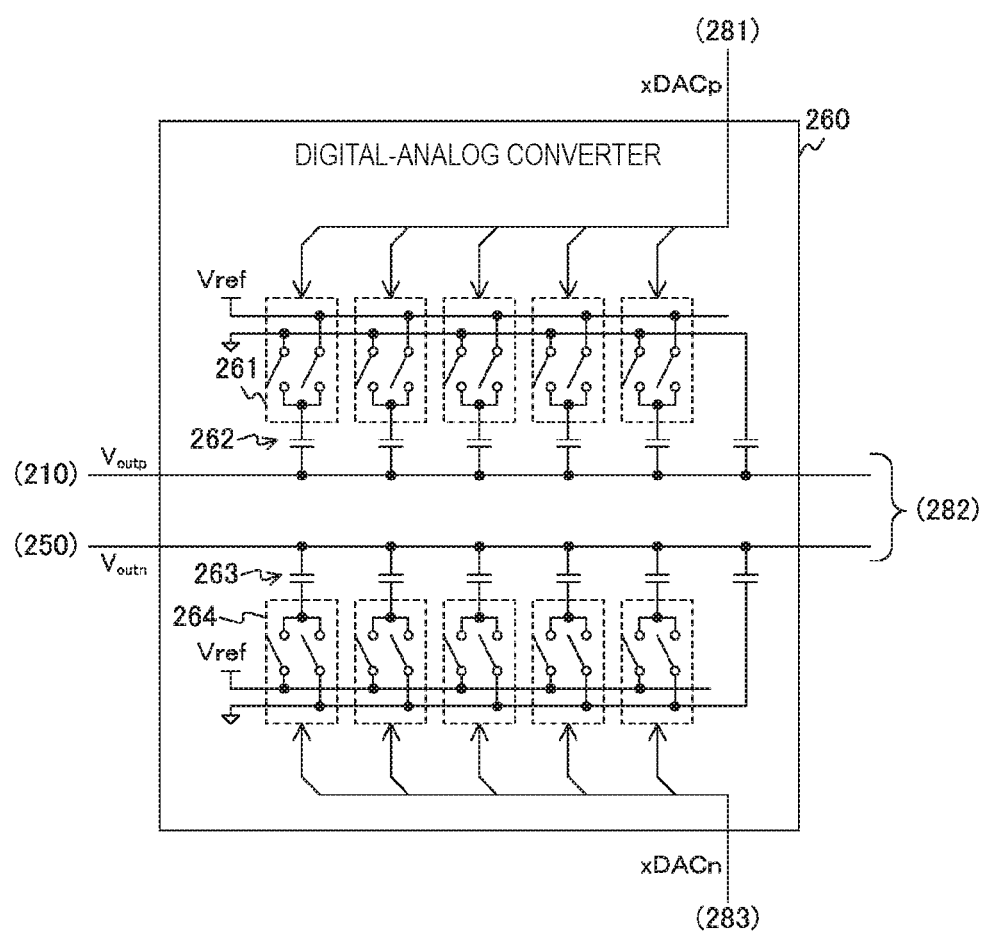
FIG. 8 is a circuit diagram illustrating a configuration example of a digital-analog converter according to the first embodiment of the present technology.

FIG. 8 is a circuit diagram illustrating a configuration example of the digital-analog converter 260 according to the first embodiment. The digital-analog converter 260 includes positive-side switches 261, positive-side condensers 262, negative-side condensers 263, and negative-side switches 264.

When a data size of a digital signal $D_{out}$ is assumed to be N bits, the numbers of the positive-side condensers 262 and the negative-side condensers 263 provided are each N. In addition, the numbers of the positive-side switches 261 and the negative-side switches 264 provided are each N−1. In addition, capacities of the respective positive-side condensers 262 are different, and capacities of the respective negative-side condensers 263 are also different.

The n-th bit (n is an integer from 1 to N−1) of a positive-side control signal xDACp is input to the n-th positive-side switch 261. In addition, the n-th positive-side condenser 262 is connected to the n-th positive-side switch 261. This positive-side switch 261 applies either of a reference voltage $V_{ref}$ and a ground voltage to one end of the corresponding positive-side condenser 262 in accordance with the value of the corresponding bit.

One ends of the first to N−1-th positive-side condensers 262 are connected to the corresponding positive-side switches 261, and the other ends thereof are connected to the positive-side sampling hold circuit 210 and the comparator 282 in common. In addition, one end of the N-th positive-side condenser 262 is connected to the ground terminal, and the other end thereof is connected to the positive-side sampling hold circuit 210 and the comparator 282.

The n-th bit of a negative-side control signal xDACn is input to the n-th negative-side switch 264. In addition, the n-th negative-side condenser 263 is connected to the n-th negative-side switch 264. This negative-side switch 264 applies either of the reference voltage $V_{ref}$ and the ground voltage to one end of the corresponding negative-side condensers 263 in accordance with the value of the corresponding bit.

One ends of the first to N–1-th negative-side condensers 263 are connected to the corresponding negative-side switches 264, and the other ends thereof are connected to the negative-side sampling hold circuit 250 and the comparator 282 in common. In addition, one end of the N-th negative-side condenser 263 is connected to the ground terminal, and the other end thereof is connected to the negative-side sampling hold circuit 250 and the comparator 282.

With the above-described configuration, the digital-analog converter 260 increases or decreases the positive-side output voltage $V_{outp}$ and the negative-side output voltage $V_{outn}$ in accordance with the positive-side control signal xDACp and the negative-side control signal xDACn.

[Configuration Example of Successive Comparison Control Unit]

Figure 9:
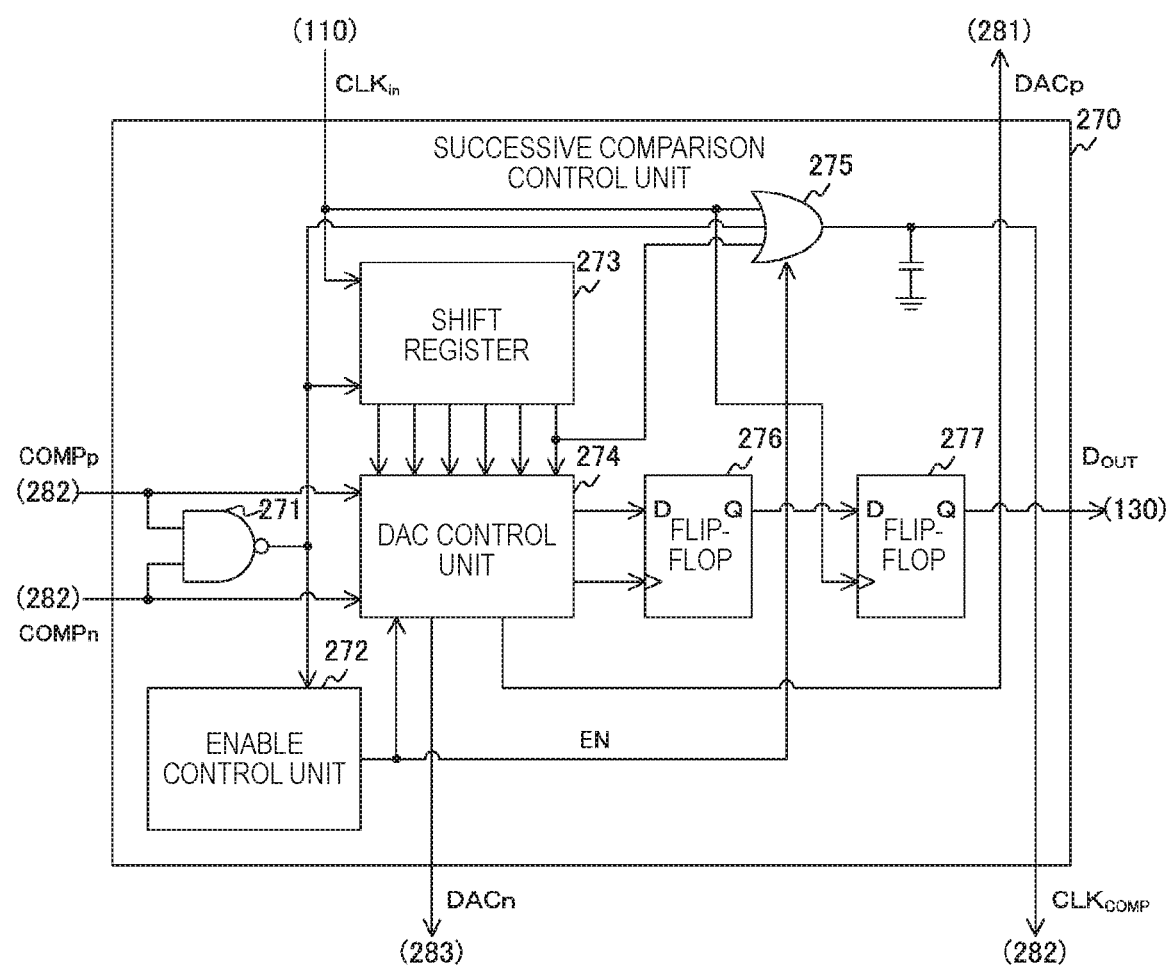
FIG. 9 is a block diagram illustrating a configuration example of a successive comparison control unit according to the first embodiment of the present technology.

FIG. 9 is a block diagram illustrating a configuration example of the successive comparison control unit 270 according to the first embodiment. The successive comparison control unit 270 includes a NAND (negative AND) gate 271, an enable control unit 272, a shift register 273, a DAC control unit 274, an OR (logical sum) gate 275, and flip-flops 276 and 277. As the flip-flops 276 and 277, for example, D-type flip-flops are used.

The NAND gate 271 computes the negative AND of comparison results COMPp and COMPn. The NAND gate 271 outputs the negative AND to the enable control unit 272 and the OR gate 275.

The enable control unit 272 generates an enable signal EN on the basis of the output value of the NAND gate 271. For example, the enable control unit 272 sets the enable signal EN to be enabled for a certain period from when the output of the NAND gate 271 is at a high level, and sets the signal to be disabled for the period other than the above period. The enable control unit 272 supplies the enable signal EN to the shift register 273, the DAC control unit 274, and the OR gate 275.

The shift register 273 is a register that shifts bits of a specific value within the circuit. When a data size of the digital signal $D_{out}$ is assumed to be N bits, the shift register 273 holds N-bit data. One of the N bits is set to "1" and the rest bits are set to "0." The shift register 273 shifts the bit of "1" in synchronization with the signal from the NAND gate 271 for the period in which the input sampling clock $CLK_{in}$ is at a low level. The position of the bit of "1" indicates a bit to be generated in the digital signal $D_{out}$. In addition, the shift register 273 supplies the held N bits to the DAC control unit 274. The last bit of the N bits is also supplied to the OR gate 275.

The DAC control unit 274 generates the positive-side control signal DACp and the negative-side control signal DACn on the basis of the comparison results COMPp and COMPn. For example, the DAC control unit 274 increases or decreases the positive-side output voltage $V_{outp}$ or the negative-side output voltage $V_{outn}$ using the positive-side control signal DACp or the negative-side control signal DACn so that the positive-side output voltage $V_{outp}$ and the negative-side output voltage $V_{outn}$ are equal. In addition, the DAC control unit 274 generates the N-bit digital signal $D_{out}$ from the N comparison results COMPp and COMPn and causes the flip-flop 276 to hold each of the bits in order.

The OR gate 275 computes the logical sum of the input sampling clock $CLK_{in}$, the output value of the NAND gate 271, and the bit from the shift register 273. The OR gate 275 outputs the signal of the logical sum to the comparator 282 as the control clock $CLK_{COMP}$.

The flip-flops 276 and 277 hold the bits of the digital signal $D_{out}$ in order. The flip-flop 277 outputs the held bits to the digital signal processing unit 130.

[Operation Example of Analog-Digital Converter]

Figure 10:
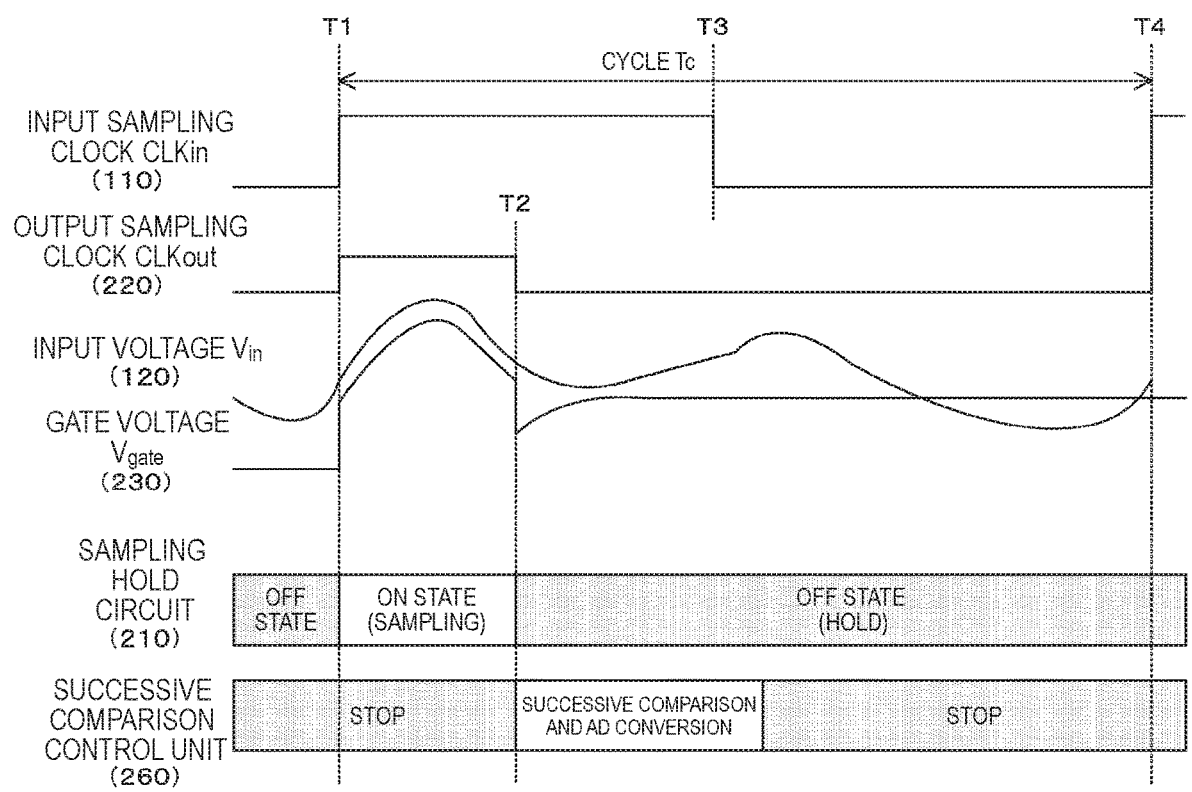
FIG. 10 is a timing chart illustrating an example of an operation of an analog-digital converter according to the first embodiment of the present technology.

FIG. 10 is a timing chart illustrating an example of an operation of the analog-digital converter 200 according to the first embodiment. The duty ratio control circuit 220 reduces the duty ratio of the input sampling clock $CLK_{in}$ and then outputs the clock as the output sampling clock $CLK_{out}$. The input sampling clock $CLK_{in}$ is assumed to be, for example, at a high level through the period from the timing T1 to T3 in the cycle. In this case, the output sampling clock $CLK_{out}$ is controlled such that it is at a high level through the period from the timing T1 to the timing T2 before the timing T3.

In addition, the bootstrap circuit 230 applies the voltage obtained by adding the charging voltage (Vdd) of the condenser 234 to the analog signal ($V_{in}$) to the gate of the N-type transistor 241 in the period in which the output sampling clock $CLK_{out}$ is at a high level. Accordingly, a gate voltage $V_{gate}$ of the N-type transistor 241 changes following the analog signal.

In addition, the positive-side sampling hold circuit 210 transitions to an ON state and performs sampling in the period in which the output sampling clock $CLK_{out}$ is at the high level. In addition, the positive-side sampling hold circuit 210 transitions to an OFF state in the period in which the output sampling clock $CLK_{out}$ is at a low level and holds the sampled signal.

In addition, when the output sampling clock $CLK_{out}$ is at the low level, the successive comparison control unit 270 starts AD conversion through successive comparison control and stops when the AD conversion ends.

Figure 11:
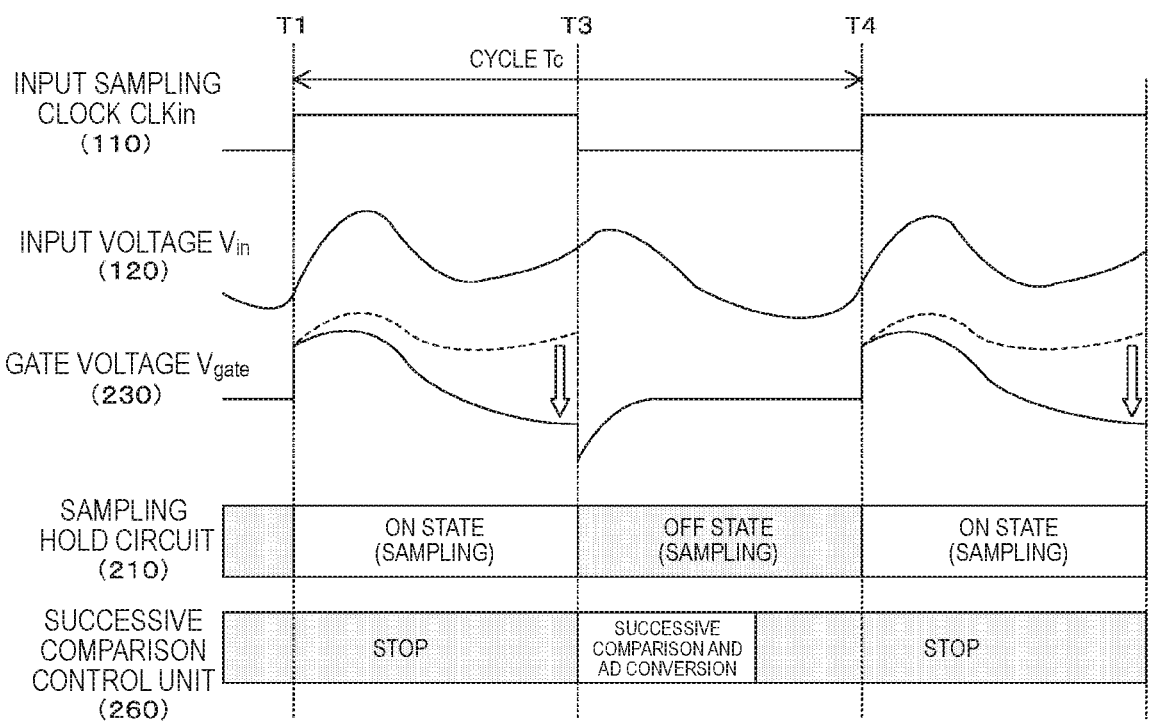
FIG. 11 is a timing chart illustrating an example of an operation of an analog-digital converter according to a comparative example.

FIG. 11 is a timing chart illustrating an example of an operation of the analog-digital converter 200 according to a comparative example. It is assumed in the comparative example that the duty ratio control circuit 220 is not disposed.

The bootstrap circuit 230 of the comparative example applies the voltage obtained by adding the charging voltage (Vdd) of the condenser 234 to the analog signal ($V_{in}$) to the gate of the N-type transistor 241 in a period in which the input sampling clock $CLK_{in}$ is at a high level. For a while from the start point of the high level period, the gate voltage $V_{gate}$ of the N-type transistor 241 changes following the analog signal. However, the gate voltage $V_{gate}$ starts to decrease with respect to the analog signal in the middle of the period, and the trajectory of the signal becomes distorted. The reason for this is that the leakage current $I_{LEAK}$ occurring at the ground-side switch 235 or the gate-side switch 238 causes the charging voltage of the condenser 234 to decrease and the gate-source voltage of the N-type transistor 241 to decrease.

On the other hand, in the case in which the duty ratio control circuit 220 is provided, the high level period is shorter, and thus the gate voltage $V_{gate}$ of the N-type transistor 241 can be changed following the analog signal ($V_{in}$) as exemplified in FIG. 10. Accordingly, the analog-digital converter 200 can perform accurate AD conversion.

Figure 12:
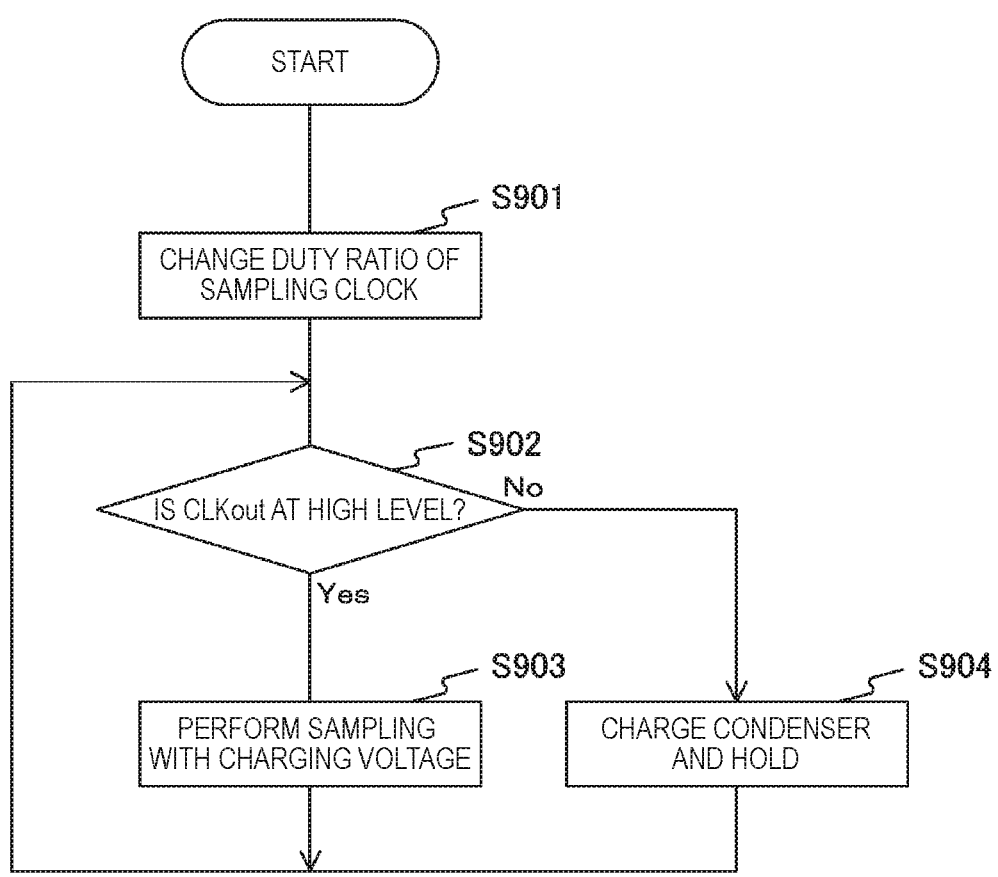
FIG. 12 is a flowchart illustrating an example of an operation of the analog-digital converter according to the first embodiment of the present technology.

FIG. 12 is a flowchart illustrating an example of an operation of the analog-digital converter 200 according to the first embodiment. This operation starts when AD conversion is instructed to the analog-digital converter 200 through a switch operation or the like.

The duty ratio control circuit 220 changes the duty ratio of the input sampling clock $CLK_{in}$ and thereby generates the output sampling clock $CLK_{out}$ (Step S901).

In addition, the analog-digital converter 200 determines whether the output sampling clock $CLK_{out}$ is at a high level (Step S902). In the case in which the output sampling clock $CLK_{out}$ is at a high level (YES in Step S902), the bootstrap circuit 230 drives the N-type transistor 241 using the charging voltage of the condenser 234. Accordingly, sampling of the analog signal is performed (Step S903).

On the other hand, in the case in which the output sampling clock $CLK_{out}$ is at a low level (NO in Step S902), the bootstrap circuit 230 charges the condenser 234. In addition, the analog-digital converter 200 holds the sampled signal and performs AD conversion (Step S904). After Step S903 or S904, the analog-digital converter 200 repeatedly executes the processes from Step S902.

As described above, according to the first embodiment of the present technology, since the analog-digital converter 200 can shorten the time in which the condenser is connected to the gate and the source of the N-type transistor 241, a decrease in the gate-source voltage caused by charging of the condenser can be suppressed. Accordingly, the drive voltage (the gate-source voltage) of the N-type transistor 241 can be maintained constant and accurate AD conversion can be performed.

2. Second Embodiment

Although the duty ratio control circuit 220 is disposed in the positive-side sampling hold circuit 210 in the above-described first embodiment, the duty ratio control circuit 220 may be disposed in a circuit other than the sampling hold circuit as long as it is a circuit that captures signals. For example, the duty ratio control circuit 220 can be disposed in a switched capacitor filter that captures and filters analog signals. An analog-digital converter 200 of a second embodiment is different from that of the first embodiment in that a duty ratio control circuit 220 is disposed in a switched capacitor filter.

Figure 13:
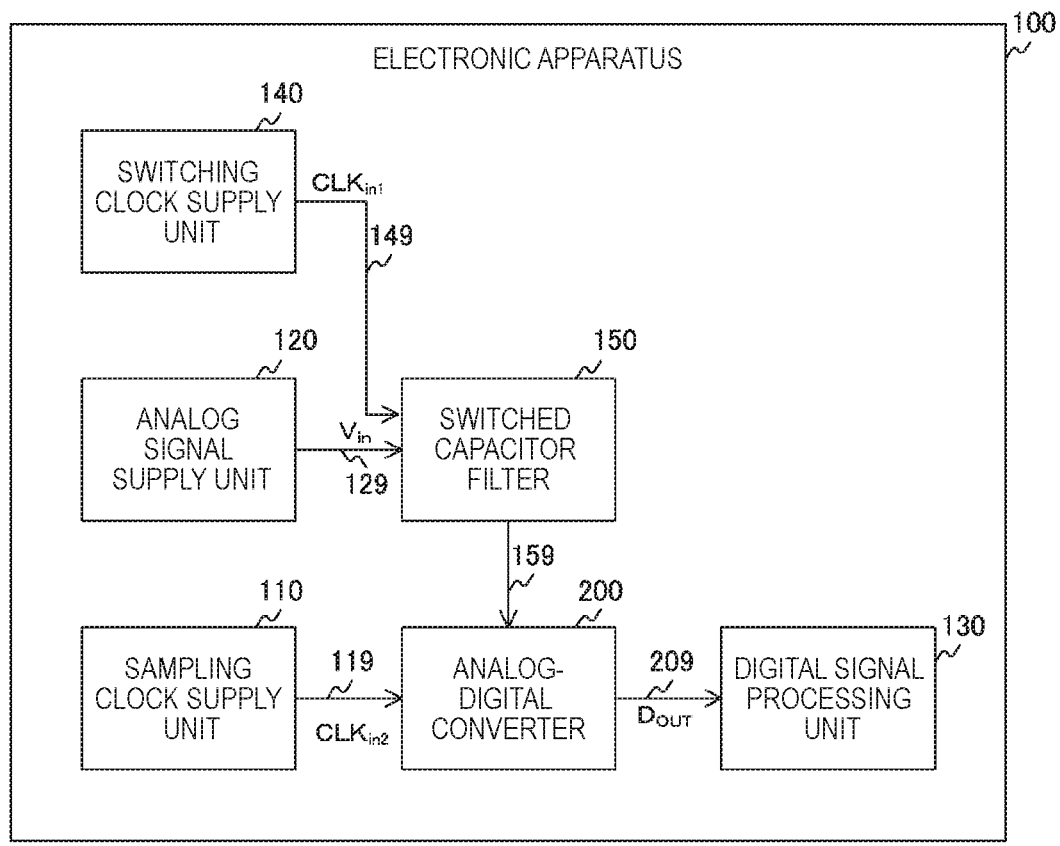
FIG. 13 is a block diagram illustrating a configuration example of an electronic circuit according to a second embodiment of the present technology.

FIG. 13 is a block diagram illustrating a configuration example of an electronic circuit 100 according to the second embodiment. The electronic circuit 100 of the second embodiment is different from that of the first embodiment in that a switching clock supply unit 140 and a switched capacitor filter 150 are further provided.

The switching clock supply unit 140 generates a periodic signal having a predetermined frequency as a switching clock $CLK_{in1}$ and supplies the clock to the switched capacitor filter 150 through a signal line 149.

The switched capacitor filter 150 captures an analog signal from an analog signal supply unit 120 in synchronization with the input switching clock $CLK_{in1}$ and performs filtering thereon. A signal of a predetermined frequency band (e.g., a higher band than a predetermined cutoff frequency) is extracted by the switched capacitor filter 150. The switched capacitor filter 150 supplies the filtered analog signal to an analog-digital converter 200 via a signal line 159.

A sampling clock supply unit 110 supplies an input sampling clock $CLK_{in2}$, and the analog-digital converter 200 performs AD conversion in synchronization with the input sampling clock $CLK_{in2}$.

Figure 14:
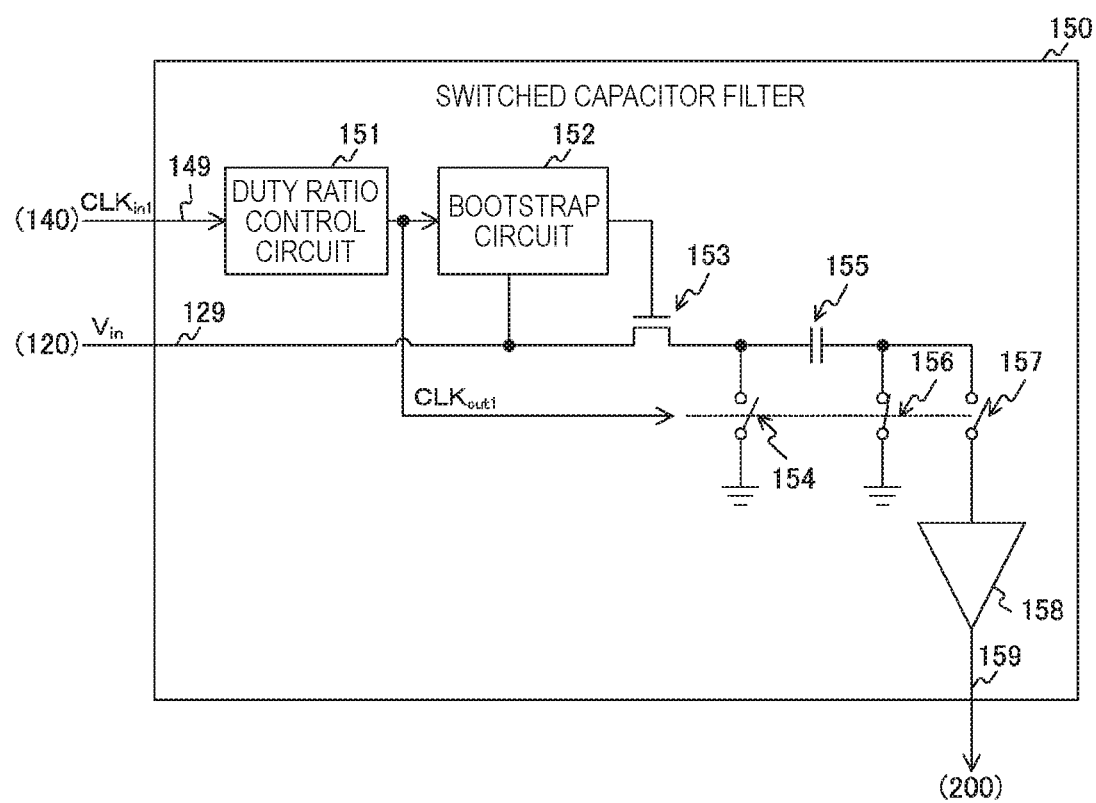
FIG. 14 is a circuit diagram illustrating a configuration example of a switched capacitor filter according to the second embodiment of the present technology.

FIG. 14 is a circuit diagram illustrating a configuration example of the switched capacitor filter 150 according to the second embodiment. The switched capacitor filter 150 includes a duty ratio control circuit 151, a bootstrap circuit 152, an N-type transistor 153, a condenser 155, switches 154, 156, and 157, and an amplifier 158.

The duty ratio control circuit 151 changes a duty ratio of the input switching clock $CLK_{in1}$. The duty ratio control circuit outputs the clock whose duty ratio has been changed to the bootstrap circuit 152, and the switches 154, 155, and 157 as an output switching clock $CLK_{out1}$. The bootstrap circuit 152 is connected to the gate and the source of the N-type transistor 153. Configurations of the duty ratio control circuit 151 and the bootstrap circuit 152 are similar to those of the duty ratio control circuit 220 and the bootstrap circuit 230 of the first embodiment.

The N-type transistor 153 outputs an input voltage $V_{in}$ input to the source from the drain. As the N-type transistor 153, for example, a MOS transistor is used.

The switches 154, 156, and 157 open and close paths in synchronization with an output switching clock $CLK_{out1}$. One end of the switch 154 is connected to the N-type transistor 153 and the condenser 155, and the other end is connected to a ground terminal. One end of the switch 156 is connected to the switch 157 and the condenser 155, and the other end thereof is connected to a ground terminal. One end of the switch 157 is connected to the condenser 155 and the switch 156, and the other end thereof is connected to the amplifier 158. Note that the condenser 155 is an example of the capacitor described in the claims.

The switches 154 and 157 transition to a closed state in a case in which the output switching clock $CLK_{out1}$ is at a high level, and transition to an open state in a case in which the output switching clock $CLK_{out1}$ is at a low level. In addition, the switch 156 transitions to a closed state in a case in which the output switching clock $CLK_{out1}$ is at a low level, and transitions to an open state in a case in which the output switching clock $CLK_{out1}$ is at a high level.

With the above-described switches 154 and 156, the condenser 155 is charged or discharged in accordance with the output switching clock $CLK_{out1}$. Accordingly, the switched capacitor filter 150 can extract a signal of a predetermined frequency band. Note that the switches 154 and 156 are an example of the charge/discharge control unit described in the claims.

The amplifier 158 amplifies an analog signal from the condenser 155 and supplies the signal to the analog-digital converter 200.

As described above, according to the second embodiment of the present technology, since the switched capacitor filter 150 shortens the time in which the condenser is connected to the gate and the source of the N-type transistor 153, a decrease in the gate-source voltage caused by discharge of the condenser can be restricted. Accordingly, a drive voltage (the gate-source voltage) of the N-type transistor 153 can be maintained constant, and thereby signal quality of a filtered signal can be improved.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

Note that effects described herein are not necessarily limitative, and any effect that is described in the present disclosure may be admitted.

Additionally, the present technology may also be configured as below.

(1)

An electronic circuit including:

a duty ratio control unit configured to change a duty ratio of a predetermined input periodic signal and output the predetermined input periodic signal as an output periodic signal;

a transistor configured to output an input signal input to a source from a drain as an output signal;

a condenser;

a charge control unit configured to charge the condenser with a predetermined voltage in a case in which the output periodic signal is not at a specific level; and a transistor drive unit configured to apply the charged predetermined voltage between a gate and the source of the transistor in a case in which the output periodic signal is at the specific level.

(2)

The electronic circuit according to (1), in which the duty ratio control circuit makes a period in which the predetermined input periodic signal is at the specific level shorter than a predetermined time.

(3)

The electronic circuit according to (2), in which the duty ratio control circuit includes an inversion unit configured to invert the predetermined input periodic signal and output the predetermined input periodic signal as an inverted signal, a delay unit configured to delay the inverted signal and output the inverted signal as a delay signal, and a selection unit configured to select the delay signal and output the delay signal as the output periodic signal in the case in which the predetermined input periodic signal is at the specific level.

(4)

The electronic circuit according to any of (1) to (3), in which the charge control unit connects both ends of the condenser to two terminals having an inter-terminal voltage of the predetermined voltage in the case in which the output periodic signal is not at the specific level, and the transistor drive unit connects both ends of the condenser to the gate and the source in the case in which the output periodic signal is at the specific level.

(5)

The electronic circuit according to any of (1) to (4), further including:

a holding unit configured to hold the output signal.

(6)

The electronic circuit according to (5), further including:

a conversion unit configured to convert the held output signal into a digital signal.

(7)

The electronic circuit according to any of (1) to (4), including:

a capacitor configured to hold the output signal; and a charge/discharge control unit configured to charge or discharge the capacitor in accordance with the output periodic signal.

(8)

A control method for an electronic circuit, the control method including:

a duty ratio control procedure of changing a duty ratio of a predetermined input periodic signal and outputting the predetermined input periodic signal as an output periodic signal;

a charge control procedure of charging the condenser with a predetermined voltage in a case in which the output periodic signal is not at a specific level; and a transistor drive procedure of applying the charged predetermined voltage between a gate and a source of a transistor in a case in which the output periodic signal is at the specific level.

REFERENCE SIGNS LIST 100 electronic circuit
110 sampling clock supply unit
120 analog signal supply unit
130 digital signal processing unit
140 switching clock supply unit
150 switched capacitor filter
151, 220 duty ratio control circuit
152, 230 bootstrap circuit
153, 233, 237, 241 N-type transistor
154, 156, 157, 222, 226 switch
155, 223 condenser
158, 225, 243 amplifier
200 analog-digital converter
210 positive-side sampling hold circuit
221 inverter
224 resistor
231 power-supply-side switch
232, 236 P-type transistor
234, 242 condenser
235 ground-side switch
238 gate-side switch
250 negative-side sampling hold circuit
260 digital-analog converter
261 positive-side switch
262 positive-side condensers
263 negative-side condensers
264 negative-side switch
270 successive comparison control unit
271 NAND (negative AND) gate
272 enable control unit
273 shift register
274 DAC control unit
275 OR (logical sum) gate
276, 277 flip-flop
281, 283 inversion unit
282 comparator

The invention claimed is:

1. An electronic circuit, comprising:

a duty ratio control unit configured to:

change a duty ratio of a determined input periodic signal; and output the determined input periodic signal as an output periodic signal;

a transistor configured to output an input signal input to a source from a drain as an output signal;

a condenser;

a charge control unit configured to charge the condenser with a determined voltage in a case in which the output periodic signal is not at a specific level; and a transistor drive unit configured to apply the determined voltage between a gate and the source of the transistor in a case in which the output periodic signal is at the specific level, wherein the duty ratio control unit includes:

an inversion unit configured to invert the determined input periodic signal and output the determined input periodic signal as an inverted signal;

a delay unit configured to delay the inverted signal and output the inverted signal as a delay signal; and a selection unit configured to select the delay signal and output the delay signal as the output periodic signal in a case in which the determined input periodic signal is at the specific level.

2. The electronic circuit according to claim 1, wherein the duty ratio control unit is further configured to make a period in which the determined input periodic signal is at the specific level shorter than a determined time.

3. The electronic circuit according to claim 1, wherein the charge control unit is further configured to connect both ends of the condenser to two terminals having an inter-terminal voltage of the determined voltage in the case in which the output periodic signal is not at the specific level, and the transistor drive unit is further configured to connect the both ends of the condenser to the gate and the source in the case in which the output periodic signal is at the specific level.

4. The electronic circuit according to claim 1, further comprising a holding unit configured to hold the output signal.

5. The electronic circuit according to claim 4, further comprising a conversion unit configured to convert the held output signal into a digital signal.

6. The electronic circuit according to claim 1, further comprising:

a capacitor configured to hold the output signal; and a charge/discharge control unit configured to one of charge or discharge the capacitor in accordance with the output periodic signal.

7. A control method comprising:

in an electronic circuit:

changing, by a duty ratio control unit, a duty ratio of a determined input periodic signal; and outputting, by the duty ratio control unit, the determined input periodic signal as an output periodic signal;

charging, by a charge control unit, a condenser with a determined voltage in a case in which the output periodic signal is not at a specific level; and applying, by a transistor drive unit, the determined voltage between a gate and a source of a transistor in a case in which the output periodic signal is at the specific level, wherein the outputting the output periodic signal further comprising:

inverting, by an inversion unit, the determined input periodic signal and outputting the determined input periodic signal as an inverted signal;

delaying, by a delay unit, the inverted signal and outputting the inverted signal as a delay signal; and selecting, by a selection unit, the delay signal and outputting the delay signal as the output periodic signal in a case in which the determined input periodic signal is at the specific level.

\* \* \* \* \*